United States Patent [19]

Santos et al.

[11] Patent Number: 5,119,399

[45] Date of Patent: Jun. 2, 1992

[54] QUADRATURE MEASUREMENT AND CALIBRATION OF A VECTOR MODULATOR

[75] Inventors: Kari A. Santos; James D. McVey, both of Palo Alto, Calif.

[73] Assignee: Hewlett-Packard Co., Palo Alto, Calif.

[21] Appl. No.: 590,576

[22] Filed: Sep. 28, 1990

[51] Int. Cl.$^5$ ............................................... H04B 3/46
[52] U.S. Cl. .................... 375/10; 332/103; 455/67.1
[58] Field of Search ........................ 375/10, 67, 39; 332/103, 104, 144; 455/67, 110

[56] References Cited

U.S. PATENT DOCUMENTS

| | | | |
|---|---|---|---|
| 3,842,247 | 10/1974 | Anderson | 455/67 |
| 4,006,418 | 2/1977 | Liskov et al. | 332/103 |
| 4,258,436 | 3/1981 | Campbell | 375/10 |
| 4,449,222 | 5/1984 | Crossett, III et al. | 375/10 |
| 4,717,894 | 1/1988 | Edwards et al. | 332/20 |
| 4,816,783 | 3/1989 | Leitch | 332/103 |
| 4,843,351 | 6/1989 | Edwards et al. | 375/10 |
| 4,890,301 | 12/1989 | Hedberg | 375/60 |

OTHER PUBLICATIONS

Wayne Tomasi, *Electronic Communications Systems*, Prentice Hall, New Jersey, 1988, Chap. 13.

*Primary Examiner*—Stephen Chin

[57] ABSTRACT

Method and apparatus for calibration of a vector modulator of electrical communication signals that produces an output composed of the vector sum of two modulated signals that are phase shifted relative to one another. The two output component signals are first calibrated to produce zero quadrature angle error, then compensated for carrier leakage and balanced to provide equal output amplitudes for equal data input amplitudes. Iteration of these calibrations is not necessary. The already-adjusted parameters remain calibrated as subsequent adjustments of other parameters are made.

10 Claims, 4 Drawing Sheets

QUADRATURE MEASUREMENT AND CALIBRATION OF A VECTOR MODULATOR

TECHNICAL FIELD

This invention relates to electrical communications and in particular to calibration of a vector modulator for use with phase shift and quadrature amplitude modulation of an electrical signal.

BACKGROUND ART

As the move from analog communications to digital communications continues, several methods of modulation are being developed. One attractive choice is vector modulation where the resultant signal is the vector sum of two amplitude modulated signals. Each vector consists of a carrier signal modulated by a data input signal, where the two vectors are shifted in phase by predetermined amounts relative to one another. Particular examples of vector modulation are quaternary phase shift keying (QPSK), in which only phase shifts occur, and 64 QAM, in which both phase shifts and amplitude shifts occur. See Chapter 13 of *Electronic Communications Systems* by Wayne Tomasi, Prentice Hall, N.J., 1988, incorporated herein by reference, for a discussion of many of the vector modulation techniques. Two modulation input signals simultaneously modulate the in-phase component vector (I channel) and the quadrature component vector (Q channel), respectively, of the carrier signal. Usually the I and Q channels of the modulator are calibrated to have equal gain (equal output amplitudes for equivalent inputs) and to have an associated phase shift of precisely 90°. This requires measurement and calibration of the vector modulator output signals to ensure equal gain in each channel, to ensure that the associated phase shift is precisely 90° (or −90°), and to remove any residual carrier signal present at the output when the input is zero (carrier leakage).

A vector modulator can be calibrated with a network analyzer that is connected to the carrier input terminals and to the modulated signal output terminals. The network analyzer can measure the amplitude and phase of the two output signals resulting from varying dc voltages applied separately to the I and Q modulation input terminals, and calibration can be performed. However, this method is expensive, cumbersome and often requires the use of additional equipment that cannot be incorporated into a vector modulator for self-calibration. This method is often limited in accuracy and may be subject to drift of some of the relevant parameters.

Edwards et al., in U.S. Pat. No. 4,717,894, discloses an iterative method of calibration of vector modulators using a scalar detector that measures the output signal issued from the modulator. An iterative four-step calibration process is followed and repeated until no further change in the results is observed. The quadrature phase error is minimized by adjusting two phase shifters provided with the vector modulator. The carrier leakage is then minimized by adjusting certain carrier leakage compensation sources to minimize RF output amplitudes with zero modulation signal applied to the input terminals of the modulator. The amplitudes of the I and Q modulation channels are then balanced by adjusting two signal attenuators associated with the data input terminals until the output amplitudes are equal for equal input amplitudes. Finally, the quadrature calibration sources are adjusted until the output amplitudes are balanced. This procedure must be repeated several times because each parameter to be calibrated cannot be accurately adjusted until the other parameters are all set perfectly.

Hedberg discloses apparatus for compensating for errors in a quadrature modulator in U.S. Pat. No. 4,890,301. Two quadrature signals, cos a(t) and sin a(t), are generated and mixed with two carrier signals, cos $\omega$t and sin $\omega$t, then added to form a standard sum signal cos $[\omega t - (t)]$. Amplitude errors (A) and phase errors (V) in the sum signal are compensated for by incorporation of a first compensation network having three adjustable signal generators. Local oscillator leakage (L) is compensated for by a second compensation network, which includes two more adjustable signal generators whose output signals are subtracted from previously generated modulation signals. This approach appears to require iterative or repetitive choices of the adjustable compensation signals rather than providing optimal compensation in a single pass. No means is suggested by which the two compensation equations obtained by the inventor can be electronically implemented.

What is needed is method and apparatus for calibrating a vector modulator that does not require a network analyzer and does not require iteration so that each step of the procedure need only be performed once in order to calibrate the modulator.

SUMMARY OF THE INVENTION

These needs are met by a method that generates predetermined frequency, where the second local oscillator signal is equal in frequency and amplitude to the first local oscillator signal, but shifted in phase by approximately 90°, and the two signals are independently adjustable in phase. First and second carrier leakage compensation dc signals of independently adjustable amplitudes $A_{clc,1}$ and $A_{clc,2}$ are provided, and first and second offset dc signals of independently adjustable amplitudes $A_{off,1}$ and $A_{off,2}$ are also provided. First and second data input signals $I_m(t)$ and $Q_m(t)$ provide carrier signal modulation data.

The first data input signal is applied to the input terminals of a first data conditioner to produce a first analog signal $A_{analog,1}$ at the output terminals of the first data conditioner. The second data input signal is applied to the input terminals of a second data conditioner to produce a second analog signal $A_{analog,2}$ at the output terminals of the second data conditioner. Examples of data conditioners are: amplifier, low-pass filter, attenuator, digital to analog converter, or a simple wire. The first analog signal $A_{analog,1}$ is applied to the input terminals of a first variable attenuator with associated attenuation factor $Atten_1$. This produces a scaled signal $A_{mod,1} = Atten_1 \cdot A_{analog,1}$ at the output terminal of the first variable attenuator. The second analog signal $A_{analog,2}$ is applied to the input terminals of a second variable attenuator with associated attenuation factor $Atten_2$. This produces a scaled signal $A_{mod,2} = Atten_2 \cdot A_{analog,2}$ at the output terminal of the second variable attenuator.

The sum of a first scaled analog signal $A_{mod,1}$ plus the first carrier leakage compensation signal $A_{clc,1}$ plus the first offset signal $A_{off,1}$ is multiplied by the first Local Oscillator signal $I_c$ to produce a first component of the output signal. The sum of a second scaled analog signal $A_{mod,2}$ plus the second carrier leakage compensation signal $A_{clc,2}$ plus the second offset signal $A_{off,2}$ is multiplied by the second Local Oscillator signal $Q_c$ to produce a second component of the output signal. These two components of the output signal are added together, and the vector sum thereof becomes the output signal.

An arbitrary value for each of the amplitudes $A_{clc,1}$, $A_{clc,2}$, $A_{off,1}$, $A_{off,2}$ is chosen. An arbitrary value for each of the amplitudes $A_{analog,1}$ and $A_{analog,2}$ (neither with zero amplitude) is chosen. Eight predetermined combinations of the attenuation values $Atten_1$ and $Atten_2$ are made that define eight points on a parallelogram. $Atten_1$ takes on at least three values $r_{1,1}$, $r_{2,1}$, $r_{3,1}$ such that $0 \leq r_{1,1} < r_{2,1} < r_{3,1}$, and $Atten_2$ takes on at least three values $r_{1,2}$, $r_{2,2}$, $r_{3,2}$ such that $0 \leq r_{1,2} < r_{2,2} < r_{3,2}$. The lengths of two intersecting parallelogram sides and the interior angle defined by the intersection of these two sides are determined. Measurement of only seven of the eight parallelogram points is sufficient to determine the interior angles of two adjacent corners of the parallelogram. For example, any one of four intermediate signal amplitudes corresponding to an attenuation factor $Attn_1 = r_{2,1}$ or $Atten_2 = r_{2,2}$ may be deleted, if desired. However, to preserve the symmetry in the following discussion, the determination of all eight points of the parallelogram will be considered. The relative phase shifts of the first and second Local Oscillator signals are adjusted until this interior angle is precisely equal to 90° (or −90°) so that the quadrature angle of the output signal is now 90° (or −90°).

To calibrate the I versus Q channel gain ratio, the data inputs $I_m(t)$ and $Q_m(t)$ must be set to equivalent values when measurements of the output signal are made. Furthermore, $I_m(t)$ and $Q_m(t)$ must be such that $A_{analog,1}$ and $A_{analog,2} \neq 0$. In a manner similar to the quadrature angle calibration, eight predetermined combinations of the attenuation values $Atten_1$ and $Atten_2$ are made that define eight points on a parallelogram. The same conditions on these values which apply for quadrature angle calibration apply for gain calibration. Based on measurements of these eight points (only five are absolutely necessary) the lengths of two intersecting parallelogram sides are determined. Knowledge of the side lengths and the attenuation values $Atten_1$ and $Atten_2$ give the I versus Q channel gain ratio. The absolute gain can be set independently based on other considerations, such as dynamic range, absolute output power, parameter adjustment range, etc. Based on the I versus Q channel gain ratio and on the absolute gain, the values of $Atten_1$ and $Atten_2$ are computed. If $I_m(t)$ and $Q_m(t)$ are set equal to equivalent values when the quadrature calibration measurements are made, no additional measurements are required.

The first and second offset signal amplitudes $A_{off,1}$ and $A_{off,2}$ and the first and second scaled analog signals $A_{mod,1} = Atten_1 \cdot Analog_1$ and $A_{mod,2} = Atten_2 \cdot Analog_2$ are now set equal to zero, and the first and second carrier leakage compensation signal amplitudes are varied so that the output signal magnitude is minimized, and $A_{clc,1}$ and $A_{clc,2}$ are fixed at these values.

The offset signal amplitudes can be used to adjust the output vector modulated signal such that, given a range of input data values for $I_m(t)$ and $Q_m(t)$, the output signal will be centered at the zero output power point. To accomplish this, the offset signal amplitudes $A_{off,1}$ and $A_{off,2}$ are adjusted so that the difference of the magnitudes of the four points of a parallelogram described by four specific values of $I_m(t)$ and $Q_m(t)$ are minimized. The quadrature angle, the two carrier leakage compensation signals $A_{clc,1}$ and $A_{clc,2}$, and the two attenuation values $Atten_1$ and $Atten_2$, are set equal to their calibrated values. Measurements of the magnitudes are made with $I_m(t)$ and $Q_m(t)$ such that the four combinations of maximum and minimum $A_{analog,1}$ and $A_{analog,2}$ are realized.

With the indicated choices of phase shifts, carrier leakage compensation voltages and offset voltages being made, the vector modulator is now compensated so that a relative phase shift between the two input modulation signals exists that is precisely 90°, or some other choice of angle, and the two output component amplitudes are balanced and the carrier leakage, if any, is eliminated.

BEST MODE FOR CARRYING OUT THE INVENTION

Figure 1:
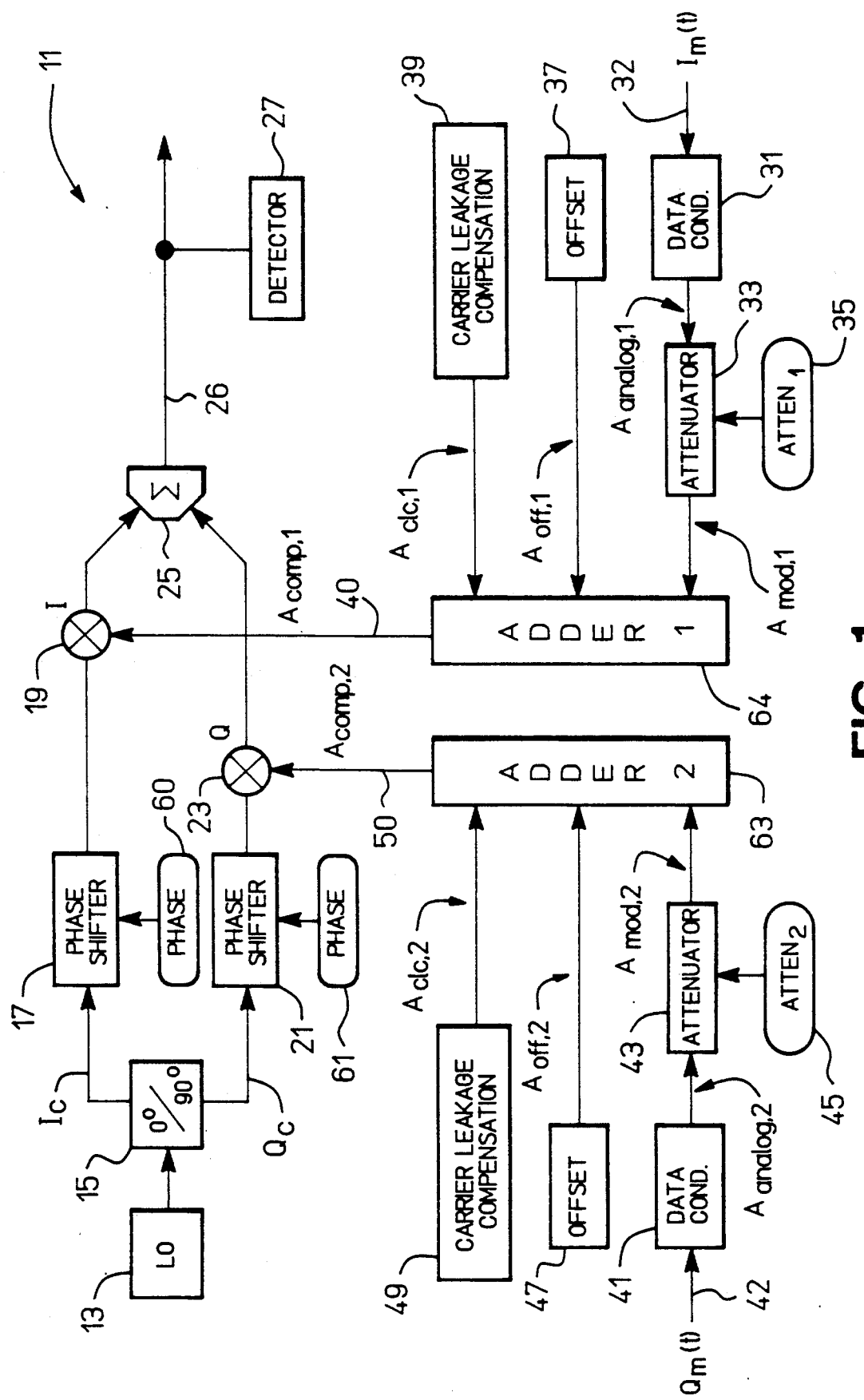
FIG. 1 is a schematic view of apparatus that may be used in one embodiment of the invention.

With reference to FIG. 1, one embodiment of vector modulator apparatus 11 includes a carrier signal source 13 which produces a carrier signal $I_c(t)$ of frequency $f_c$. This carrier signal is received by a signal splitter module 15 that reproduces and issues the original carrier signal $I_c(t)$ at a first output terminal, and also reproduces the carrier signal, shifts the carrier signal phase by approximately 90° relative to the signal at the first output terminal, and then issues this phase-shifted carrier signal $Q_c(t)$ at a second output terminal thereof. The signal $I_c(t)$ is received at a first adjustable phase shift module 17, adjusted by its controller Phase 60, that introduces an arbitrarily adjustable first phase shift $\phi_1$ and issues this phase shifted signal as an output signal $I_c(t,\phi_1)$ that is received by a multiplier or other mixer module 19 as shown. The signal $Q_c(t)$ is received by a second adjustable phase shift module 21, adjusted by its controller Phase 61, that introduces an arbitrarily adjustable second phase shift $\phi_2$ and issues this as an output signal $Q_c(t,\phi_2)$ that is received by a second multiplier or mixer module 23 as shown. The mixer module 19 also receives a second input signal $I'_m$, discussed below, and forms and issues the product function $I'_m I_c(t,\phi_1)$ as a first component of the output signal that is received by a sum module 25 as shown. The second mixer module 23 also receives a second input signal $Q'_m$, discussed below, and forms and issues the product $Q'_m Q_c(t,\phi_2)$ as a second component of the output signal that is received by the sum module 25 as shown. The sum of the two input signals received by the sum module 25 is issued as the output signal on an output line 26, and a calibrated signal detector 27 is positioned to monitor the output signal issued on line 26 for purposes of measurement or calibration of the vector modulator 11.

A first data conditioner module 31 receives a first data input control signal $I_m(t)$ on an input line 32. The data conditioner module 31 forms and issues an output signal $A_{analog,1}$ that depends on $I_m(t)$. This signal $A_{analog,1}$ is delivered to and serves as one input for an attenuation module 33. The module 33 also receives a first control input signal having a value $Atten_1$ from a first attenuation parameter input module 35, and forms and issues the product $A_{mod,1} = Atten_1 \cdot A_{analog,1}$. The parameter $Atten_1$ has any of three values $r_{1,1}$, $r_{2,1}$, $r_{3,1}$ during quadrature calculation, where $0 \leq r_{1,1} < r_{2,1} < r_{3,1}$ and serves as an adjustable attenuation parameter whose value is chosen by an operator that controls the first attenuation input module 35. An offset voltage module 37 supplies an adjustable dc offset signal $A_{off,1}$, and a carrier leakage compensation voltage module 39 supplies a compensation signal $A_{clc,1}$ as shown. The three signals $A_{mod,1}$, $A_{off,1}$ and $A_{clc,1}$ are summed together to form a first sum signal $i'_m = Atten_1 \cdot a_{analog,1} + A_{off,1} + A_{clc,1}$ on a signal line 40 that is connected to a second input terminal of the first mixer module 19 as shown.

A second data conditioner module 41 receives a second data input control signal $Q_m(t)$ on an input line 42. The data conditioner module 41 forms and issues an output signal $A_{analog,2}$ that depends upon $Q_m(t)$. The data conditioner modules 31 and 41 may each be a simple wire, a digital-to-analog converter, a signal amplifier, a signal attenuator, a low pass filter, or other similar signal processor. This signal $A_{analog,2}$ is delivered to and serves as one input for an attenuation module 43. The module 43 also receives a second control input signal having a value $Atten_2$ from a second attenuation parameter input module 45, and forms and issues the product $A_{mod,2} = Atten_2 \cdot A_{analog,2}$. The parameter $Atten_2$ has any of three values $r_{1,2}$, $r_{2,2}$, $r_{3,2}$ where $0 \leq r_{1,2} < r_{2,2} < r_{3,2}$ during quadrature calculation, and serves as an adjustable attenuation parameter whose value is chosen by an operator that controls the second attenuation input module 45. An offset voltage module 47 supplies an adjustable dc offset signal $A_{off,2}$, and a carrier leakage compensation signal module 49 supplies a compensation signal $A_{clc,2}$ as shown. The three signals $A_{mod,2}$, $A_{off,2}$ and $A_{clc,2}$ are summed together to form the second sum signal $Q'_m = Atten_2 \cdot A_{analog,2} + A_{off,2} + A_{clc,2}$ on a signal line 50 that is connected to a second input terminal of the second mixer module 23 as shown.

The first and second data inputs $I_m(t)$ and $Q_m(t)$ are preferably each constant when calibrations are performed but may be generally time-varying. Only the products $A_{mod,1} = Atten_1 \cdot A_{analog,1}$ and $A_{mod,2} = Atten_2 \cdot A_{analog,2}$ need to be at specific values when measurements are made using the calibrated detector module 27.

Conventional quaternary phase shift keying ("QPSK"), as discussed by W. Tomasi, *Electronic Communications Systems*, op. cit., would use the carrier signal module 13, the phase shift module 15, the two mixer modules 19 and 23, the sum module 25 and the data input lines 32 and 42 to provide a conventional QPSK output signal on line 26. The two adjustable phase shift modules 17 and 21, adjusted by their respective controllers Phase 60 and Phase 61, the two data conditioning modules 31 and 41, the two attenuation modules 33 and 43, the two attenuation parameter input modules 35 and 45, the two offset signal modules 37 and 47, and the two carrier leakage compensation signal modules 39 and 49 also are provided here in order to measure and calibrate the system according to the invention. More general vector modulation of the output signal on the output line 26 can be provided here.

To begin, nominal values (e.g. a few tens of millivolts voltage or a few milliamps current) for each of the signals $A_{off,1}$, $A_{clc,2}$, $A_{off,2}$ and $A_{clc,2}$ are chosen and temporarily fixed. The amplitude of $A_{mod,1} = Atten_1 \cdot A_{analog,1}$ is varied among three values. For simplicity, it is assumed here that $A_{analog,1}$ is held at a constant, non-zero value when measurements are made using calibrated detector module 27, and that the attenuation parameter $Atten_1$ changes among the three values $r_{1,1}$, $r_{2,1}$, $r_{3,1}$. In a similar manner, it is assumed that $A_{analog,2}$ is held at a constant, non-zero value when measurements are made and that the attenuation parameter $Atten_2$ is varied among the three values $r_{1,2}$, $r_{2,2}$ and $r_{3,2}$. With appropriate choices of the pairs of variables ($A_{mod,1}$, $A_{mod,2}$), the following eight points are defined in a two-dimensional coordinate space:

A: $(A_{off,1} + A_{clc,1} + r_{1,1} A_{analog,1},\ A_{off,2} + A_{clc,2} + r_{1,2} A_{analog,2})$ B: $(A_{off,1} + A_{clc,1} + r_{3,1} A_{analog,1},\ A_{off,2} + A_{clc,2} + r_{1,2} A_{analog,2})$ C: $(A_{off,1} + A_{clc,1} + r_{3,1} A_{analog,1},\ A_{off,2} + A_{clc,2} + r_{3,2} A_{analog,2})$ D: $(A_{off,1} + A_{clc,1} + r_{1,1} A_{analog,1},\ A_{off,2} + A_{clc,2} + r_{3,2} A_{analog,2})$ E: $(A_{off,1} + A_{clc,1} + r_{2,1} A_{analog,1},\ A_{off,2} + A_{clc,2} + r_{1,2} A_{analog,2})$ F: $(A_{off,1} + A_{clc,1} + r_{1,1} A_{analog,1},\ A_{off,2} + A_{clc,2} + r_{2,2} A_{analog,2})$ G: $(A_{off,1} + A_{clc,1} + r_{2,1} A_{analog,1},\ A_{off,2} + A_{clc,2} + r_{3,2} A_{analog,2})$ H: $(A_{off,1} + A_{clc,1} + r_{3,1} A_{analog,1},\ A_{off,2} + A_{clc,2} + r_{2,2} A_{analog,2})$ One suitable set of choices of the attenuation parameters here is $r_{1,1} = r_{1,2} = 0$, $r_{2,1} = r_{2,2} = 0.5$ and $r_{3,1} \leq r_{3,1} = 1$, but more general choices can be made.

Figure 2:
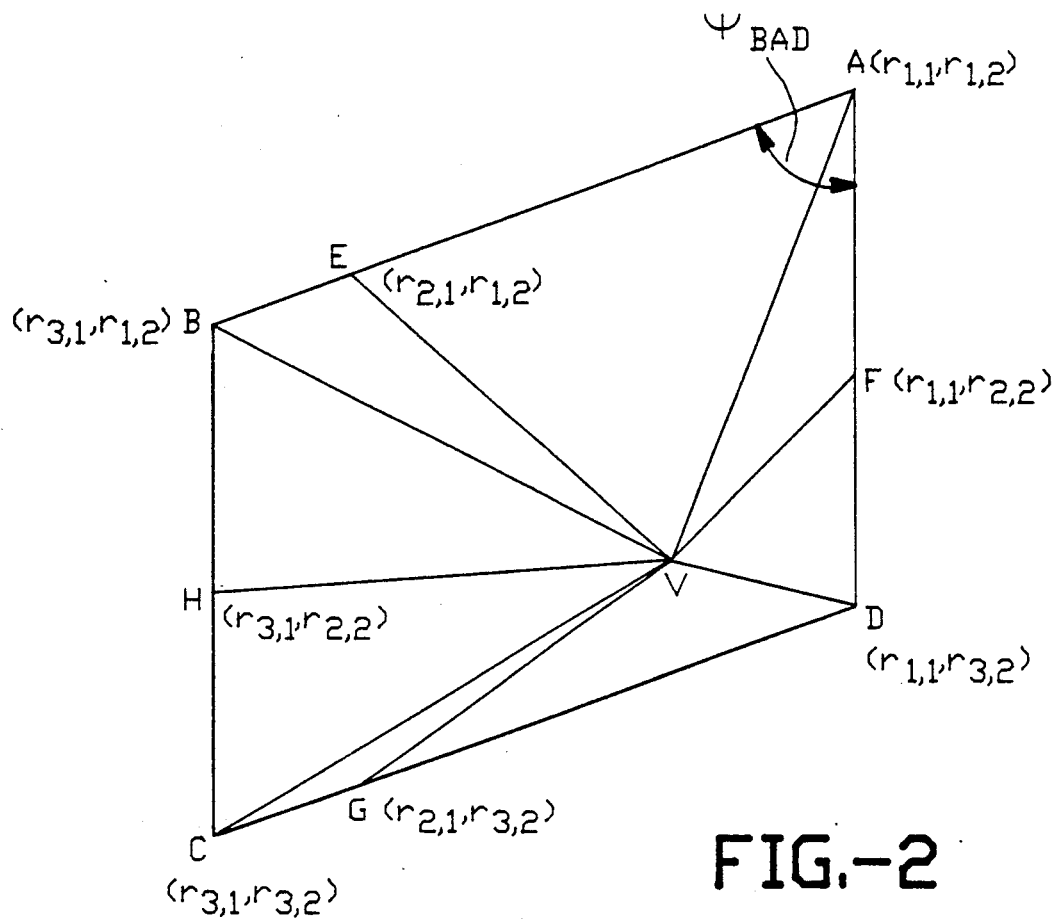
FIG. 2 is a graphical view of a parallelogram that is defined by eight measurements and using the system in FIG. 1, from which calibration of this system may be made.

The above points, representing vector sums of the output signal $I'_m \cdot I_c(t,\phi_1) + Q'_m \cdot Q_c(t,\phi_2)$, are illustrated in a two dimensional plot shown in FIG. 2 as the points A, B, ..., H on a parallelogram (more generally, a quadrilateral) ABCD as shown, where the four points E, F, G, and H represent intermediate positions on the four boundary lines that define the parallelogram ABCD. A ninth point, indicated by V in FIG. 2, corresponds to zero output signal on the output line 26 (if not a corner pair). The vertex point V may lie inside or outside the parallelogram ABCD or on a boundary segment thereof but may not coincide with one of the corners of the parallelogram. The maximum amplitudes of the output signal appearing on the output line 26 for each of the eight sets of coordinates given above are measured, and the maximum amplitude measurement for the vertex point V is subtracted from the amplitude measurements of each of the eight points of the quadrilateral. These eight measurements are identified with the lengths of the line segments AV, BV, CV, DV, EV, FV, GV, and HV shown in FIG. 2.

Figure 3:
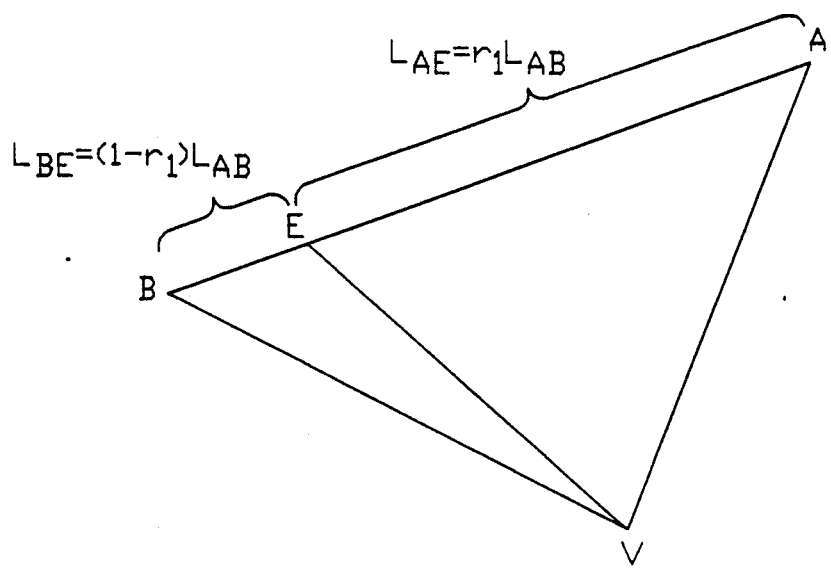
FIG. 3 is a graphical view of one portion of the parallelogram used to determine a length of a side thereof.

FIG. 3 illustrates the relationship of two triangles AEV and BEV that form part of the parallelogram shown in FIG. 2. The length $L_{AB}$ of one side of the overall triangle ABV is now found. Similar arguments apply to determine the lengths $L_{AD}$, $L_{CD}$ ($=L_{AB}$) and $L_{BC}$ ($=L_{AD}$) of the parallelogram ABCD shown in FIG. 2.

A triangle having three sides of lengths a, b and c and a perimeter length given by $2s = a + b + c$ is known from trigonometry to have the triangle area given by $$Triangle\ area = [s(s-a)(s-b)(s-c)]^{(\frac{1}{2})} \quad (1)$$

With reference to the triangles AEV and BEV shown in FIG. 3, the areas of these two triangles are related as shown in Equation (2).

$$Area\ (AEV)\ (r_{3,1}-r_{1,1})/(r_{2,1}-r_{1,1}) = Area\ (BEV) \\ (r_{3,1}-r_{1,1})/(r_{3,1}-r_{2,1}) \quad (2)$$

If $2s_1$ and $2s_2$ are the lengths of the perimeters of the respective triangles AEV and BEV, as shown in Equations (3) and (4), the areas of the two triangles AEV and BEV are related as shown in Equation (5).

$$s_1 = (L_{AE}+L_{EV}+L_{AV})/2, \quad (3)$$

$$s_2 = (L_{BE}+L_{EV}+L_{BV})/2, \quad (4)$$

$$s_1(s_1-L_{AE})(s_1-L_{EV})(s_1-L_{AV})[(r_{3,1}-r_{2,1})/ \\ (r_{3,1}-r_{1,1})]^2 = s_2(s_2-L_{BE})(s_2-L_{EV})(s_2-L_{BV}) \\ [(r_{2,1}-r_{1,1})/(r_{3,1}-r_{1,1})]^2 \quad (5)$$

where the line segment lengths $L_{AE}$ and $L_{BE}$ are given by $$L_{AE} = L_{AB}(r_{2,1}-r_{1,1})/(r_{3,1}-r_{1,1}). \quad (6)$$

$$L_{BE} = L_{AB}(r_{3,1}-r_{2,1})/(r_{3,1}-r_{1,1}). \quad (7)$$

The line segment lengths AV, BV and EV are known from measurements of the amplitudes of the output signal appearing on the output line 26 in FIG. 1. The unknown line segment length $L_{AB}$ is found by rearranging Equation (5). This yields the expressions shown in Equations (8) and (10), viz.

$$L_{AB} = [(L_{AV}^2 - L_{BV}^2) \pm [(L_{AV}^2 - L_{BV}^2)^2 - (r_1^2 - 1) \quad (8) \\ ((1/r_1^2)(L_{AV}^2 - L_{EV}^2)^2 - (L_{BV}^2 - L_{EV}^2)^2)]^{(\frac{1}{2})} \times \\ (r_1 + 1)/(r_1 - 1)]^{(\frac{1}{2})} \quad (r_1 \neq 1).$$

$$r_1 = (r_{2,1}-r_{1,1})/(r_{3,1}-r_{2,1}). \quad (9)$$

$$L_{AB} = 2^{(\frac{1}{2})} \times [L_{AV}^2 + L_{BV}^2 - 2L_{EV}^2]^{(\frac{1}{2})} \quad (r_1=1) \quad (10)$$

If choices of $r_{1,1}$, $r_{2,1}$, and $r_{3,1}$ are made so that $r_1=1$, the numerator and denominator in Equation (8) both vanish and a simpler expression, shown in Equation (10), is found for the line segment length $L_{AB}$.

The proper choice of the + or − sign in Eq. (8) is determined as follows. The two length values $L_{AV}$ and $L_{BV}$ are compared with $L_{EV}$, and one of the three (possible) situations set forth in Table 1 is determined to be present. In the first situation, ($L_{EV}<L_{AV}$, $L_{EV}\geq L_{BV}$), choose the negative sign in Eq. (8). In the second situation ($L_{EV}\geq L_{AV}$, $L_{EV}<L_{BV}$), choose the positive sign in Eq. (8). In the third situation ($L_{EV}<L_{AV}$, $L_{EVB}<L_{BV}$), form the ratios $$r_1^2 = (r_{2,1}-r_{1,1})^2/(r_{3,1}-r_{2,1})^2$$

$$r^2 = (L_{AV}^2-L_{EV}^2)/(L_{BV}^2-L_{EV}^2)$$

and compare these two ratios. If $r_1^2>r^2$, choose the positive sign in Eq. (8). If $r_1^2<r^2$, choose the negative sign in Eq. (8). If $r_1^2=r^2$, the quantity inside the inner square root sign $[-]^{\frac{1}{2}}$ Eq. (8) vanishes so that choice of the sign is of no importance.

TABLE 1

| Side Length Relations in FIG. 3 | | |
|---|---|---|
| | $L_{EV} \geq L_{BV}$ | $L_{EV} < L_{BV}$ |
| $L_{EV} \geq L_{AV}$ | Impossible | (2) Choose − |
| $L_{EV} < L_{AV}$ | (1) Choose + | (3) Compare $r_1^2$ and $r^2$ |

Once the lengths $L_{AB}$ and $L_{AD}$ have been determined, the angles $\psi(VAD)$ and $\psi(VAB)$ can be determined from the well known cosine law from trigonometry, viz.

$$\psi(VAD) = Cos^{-1}[(L_{AV}^2+L_{AD}^2-L_{DV}^2)/(2 L_{AV}L_{AD})] \quad (11)$$

$$\psi(VAB) = COS^{-1}[(L_{AV}^2+L_{AB}^2-L_{BV}^2)/(2 L_{BV}L_{AB})] \quad (12)$$

$$\psi(BAD) = |\psi(VAD)\pm\psi(VAB)| \text{ or} \\ 360° - (\psi(VAD)+\psi(VAB)) \quad (13)$$

Figure 4:
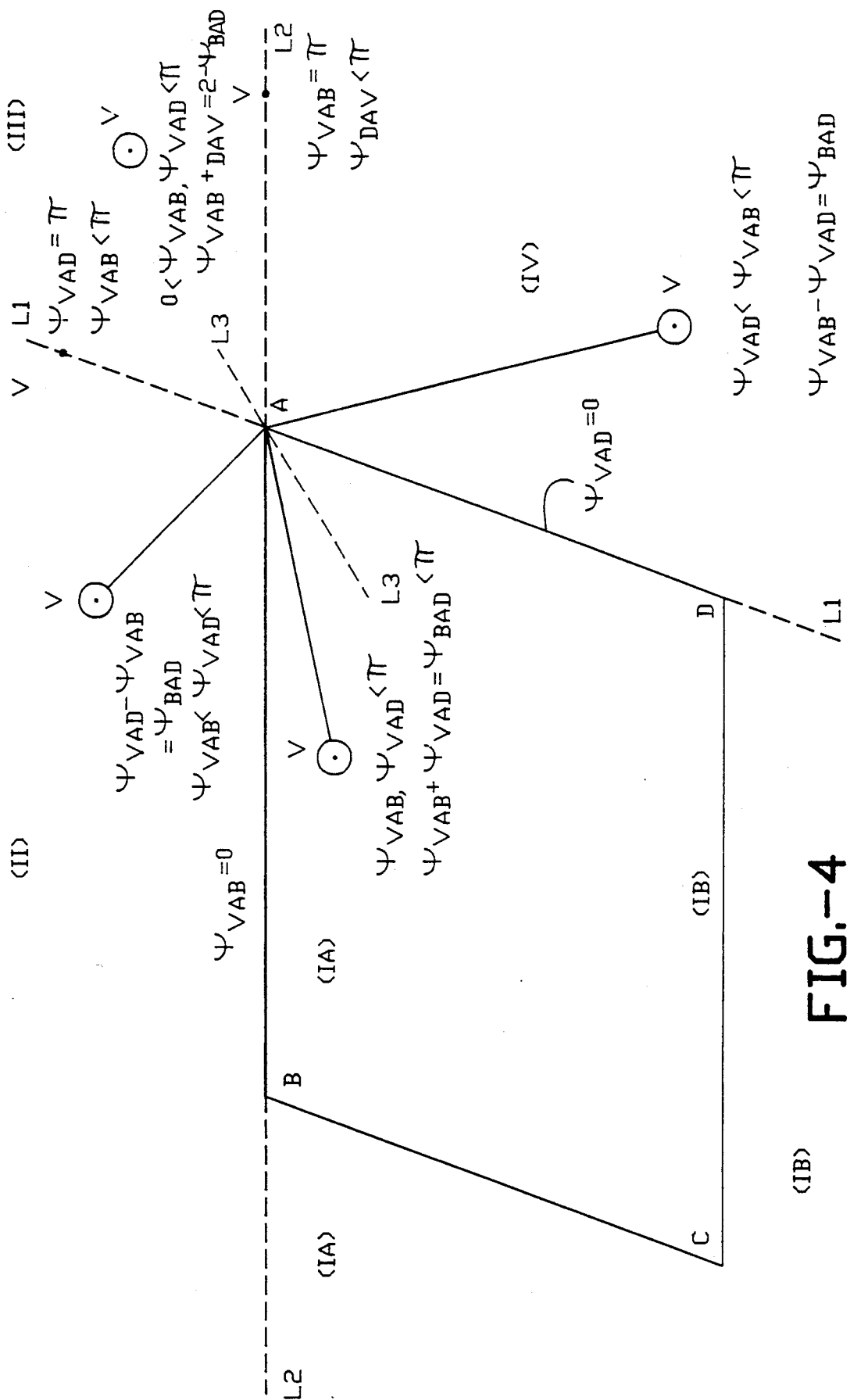
FIG. 4 is a graphical view of one portion of parallelogram used to determine the angles thereof.

The cosine function cos(w) is a continuous, strictly monotonically decreasing function of the variable w in the intervals $0° \leq w \leq 180°$ so that no ambiguities arise in Eqs. (11)–(13). However, the position of the vertex V relative to the corners A, B, C and D may be any of the four configurations illustrated in FIG. 4.

The lines denoted L1 and L2 have line segments coinciding with the segments AD and AB, respectively, of the parallelogram ABCD as shown.

Juxtaposition of the two lines L1 and L2 divides the plane into four generalized quadrants, denoted I, II, III and IV, with quadrant I containing the parallelogram ABCD. For vertex V=V1 lying in quadrant I, including the relevant parts of the lines L1 and L2, the following relations hold:

$$0 < \psi(VAB) + \psi(VAD) < 180°, \quad (14)$$

$$\psi(VAB) + \psi(VAD) = constant = \psi(BAD) < 180° \quad (15)$$

For vertex V=V2 lying in quadrant II, excluding any parts of the lines L1 and L2, the following relations hold:

$$\psi(VAB) < \psi(VAD) < 180°, \quad (16)$$

$$\psi(VAD) - \psi(VAB) = constant = \psi(BAD) \quad (17)$$

For vertex V=V4 lying in quadrant IV, excluding any parts of the lines L1 and L2, the following relations hold:

$$\psi(VAD) < \psi(VAB) < 180°, \quad (18)$$

$$\psi(VAB) - \psi(VAD) = constant = \psi(BAD) \quad (19)$$

For vertex V=V3 lying in quadrant III, including the relevant parts of the lines L1 and L2, the following relations hold:

$$\psi(VAB), \psi(VAD) \leq 180°, \quad (20)$$

$$\psi(VAB) + \psi(VAD) = constant \geq 180° \quad (21)$$

$$\psi(BAD) = 360° - (\psi(VAB)+\psi(VAD)) \quad (22)$$

For a given pair of computed angles $\psi(VAB)$ and $\psi(VAD)$, the possible quadrant which contains V and thus the value of $\psi(BAD)$ can be narrowed down from the four possible quadrants described above to two of the quadrants by commuting the sum and difference of $\psi(VAB)$ and $\psi(VAD)$.

$180° \leq \psi(VAB) + \psi(VAD) \leq 360°$, V cannot be in quadrant I $\psi(VAB) + \psi(VAD) < 180°$, V cannot be in quadrant III $\psi(VAD) \leq \psi(VAB) < 0°$ V cannot be in quadrant IV $\psi(VAB) - \psi(VAD) < 0°$ V cannot be in quadrant II The vertex point V can only be in one of two contiguous quadrants, and $\psi(BAD)$ is one of two possible angles. To determine which angle is correct, the angle $\psi(CBA)$ or the angle $\psi(CDA)$ is analyzed in a similar manner to determine the two possible values for that angle. For instance if angle $\psi(CBA)$ is analyzed, then the values of angles $\psi(VBC)$ and $\psi(VBA)$ are computed, and two possible values of $\psi(CBA)$ are determined. Since ABCD is a parallelogram, the sum of two consecutive interior angles is 180°. Each of the consecutive angles has two possible values, as determined above, so there are 4 combinations of angle sums, $\psi(BAD) + \psi(CBA)$, one of which will add up to 180°. That pair of values will be chosen for $\psi(BAD)$ and (CBA).

After the lengths $L_{AB}$ and $L_{AD}$ and the included angle $\psi(BAD)$ have been found, this formalism is first applied to correction of any quadrature error in the vector modulator 11 in FIG. 1. Ideally, the angle $\psi(BAD) = 90°$ (or $-90°$), although a different predetermined angle $\psi_O$ can be used. However, if this angle differs from 90° (or $-90°$), either the adjustable phase shift $\phi_1$ or the adjustable phase shift $\phi_2$, or both, is adjusted either by the phase shift controller Phase 60 for the phase shifter module 17 or the phase shifter controller Phase 61 for the phase shifter module 21 until the quadrature angle associated with vector modulator 11 is 90° (or $-90°$). Fix these choices of phase shift angles. If the phase shifts $\phi_1$ and $\phi_2$ are both changed by the same amount and in the same direction, the quadrature angle should stay fixed at 90° (or $-90°$), although other parameters associated with the output signal from the vector modulator 11 in FIG. 1 may change.

The calibration required to produce a quadrature angle of 90° is only done once here. No iterations are required.

For equivalent data input signals $I_m(t)$ and $Q_m(t)$, the I and Q components of the vector modulated output signal should have relative amplitudes determined by a predetermined ratio. Most often this ratio is unity. For example, in normal QPSK modulation, the I and Q amplitudes are equal. To calibrate the I versus Q channel gain ratio, the data input signals $I_m(t)$ and $Q_m(t)$ must be set to equivalent values when measurements of the output signal are made and $I_m(t)$ and $Q_m(t)$ must be such that $A_{analog,1}$ and $A_{analog,2}$ are non-zero. In a manner similar to the quadrature angle calibration, the side lengths of two consecutive sides of a parallelogram are determined. This requires five measurements of the output signal maximum amplitude. The attenuation parameter $Atten_1$ is varied among three predetermined values $r_{4,1}$, $r_{5,1}$ and $r_{6,1}$ such that $0 \leq r_{4,1} < r_{5,1} < r_{6,1}$. The attenuation parameter $Atten_2$ is also varied among three predetermined values $r_{4,2}$, $r_{5,2}$ and $r_{6,2}$ such that $0 \leq r_{4,2} < r_{5,2} < r_{6,2}$. With appropriate choices of the pairs of variables, the following five points are defined in a two-dimensional coordinate space, analogous to FIG. 2:

A': $(A_{off,1} + A_{clc,1} + r_{4,1}A_{analog,1}, A_{off,2} + A_{clc,2} + r_{4,2}A_{analog,2})$ B': $(A_{off,1} + A_{clc,1} + r_{6,1}A_{analog,1}, A_{off,2} + A_{clc,2} + r_{4,2}A_{analog,2})$ D': $(A_{off,1} + A_{clc,1} + r_{4,1}A_{analog,1}, A_{off,2} + A_{clc,2} + r_{6,2}A_{analog,2})$ E': $(A_{off,1} + A_{clc,1} + r_{5,1}A_{analog,1}, A_{off,2} + A_{clc,2} + r_{4,2}A_{analog,2})$ F': $(A_{off,1} + A_{clc,1} + r_{4,1}A_{analog,1}, A_{off,2} + A_{clc,2} + r_{5,2}A_{analog,2})$ It is often simpler to have the attenuation values for this gain ratio calibration section be the same as for the quadrature calibration section, e.g. $r_{4,1} = r_{1,i}$, $r_{5,i} = r_{2,i}$, $r_{6,i} = r_{3,1}$ (i = 1,2). Furthermore, if the data input signals $I_m(t)$ and $Q_m(t)$ are set to equivalent values during quadrature calibration, then no new measurements need to be made at this time. Based on measurements of these five points, the lengths of two intersecting parallelogram sides are again determined using equations (8), (9) and (10).

The ratio of the calibrated values of $Atten_1$ and $Atten_2$ is given by the ratio of the parallelogram side lengths times the ratio of the differences of the attenuation factors times the desired I versus Q channel gain ratio:

$$Atten_1/Atten_2 = (L_{AD}/L_{AB})[r_{6,1} - r_{4,1}]/(r_{6,2} - r_{4,2})]$$
(Desired I/Q ratio)

The absolute gain can be set independently, based on other considerations such as dynamic range, absolute output power, parameter adjustment range, etc. For example, it is often desired to keep both $Atten_1 \leq 1$ and $Atten_2 \leq 1$. Based on the I versus Q channel gain ratio and on the absolute gain considerations, values of $Atten_1$ and $Atten_2$ are computed and fixed. The I versus Q channel gain need be calibrated only once. No iterations are required.

The contribution of the carrier leakage is now compensated for and minimized. Set the $Atten_i$ values (i = 1,2), or $I_m$ and $Q_m$, so that $A_{mod,1}$ and $A_{mod,2}$ are equal to 0, and set offset signals $A_{off,1}$ and $A_{off,2}$ equal to 0, with the quadrature angle fixed at 90° as discussed above. Now adjust the amplitudes of the dc signals $A_{clc,1}$ and $A_{clc,2}$ so that their individual contributions to the total output signal, as measured on the output line 26 in FIG. 1, are minimized. Fix the leakage compensation signals $A_{clc,1}$ and $A_{clc,2}$ at the respective values for which this minimization is achieved.

Ideally, the carrier leakage contributions could be eliminated altogether. However, because of certain noise thresholds that exist within the vector modulator itself, it is likely that the carrier leakage contributions will persist in the system, albeit at reduced levels obtained as discussed above.

The local oscillator 13 in FIG. 1 often does not produce a pure oscillatory signal at the desired carrier frequency $f_c$ so that other frequencies $f \neq f_c$ such as overtones and undertones are also present in the modulator output signal on output line 26. These undesired contributions to the modulator output signal produce a total output that resembles the solid line shown in FIG. 5, rather than resembling the idealized dashed line shown there, where measured modulator output signal versus $A_{CLC,i}$ (i = 1 or 2) is illustrated. The "true" minimum of the modulator output signal M is attained for the choice $A = A_0$, but this behavior is masked by the appearance of the undesired contributions to M. These undesired contributions are approximately independent of the magnitude of the carrier leakage compensation coefficient $A = A_{CLC,i}$ so that the ratio of such contributions divided by M should be very small for values of A sufficiently far from $A_0$. Thus, the measured points on the solid curve having coordinates $(A_j, M_j)$ (j=1, 2, 3, 4, 5) in FIG. 5 closely match the points on a "true" M versus A curve. It is assumed here that near $A=A_0$ the "true" modulator output signal curve may be represented approximately as a quadratic function of the CLC parameter A, viz.

$$M_q(A) = M_{q0} + M_{q1}A + M_{q2}A^2 \quad (23)$$

Figure 5:
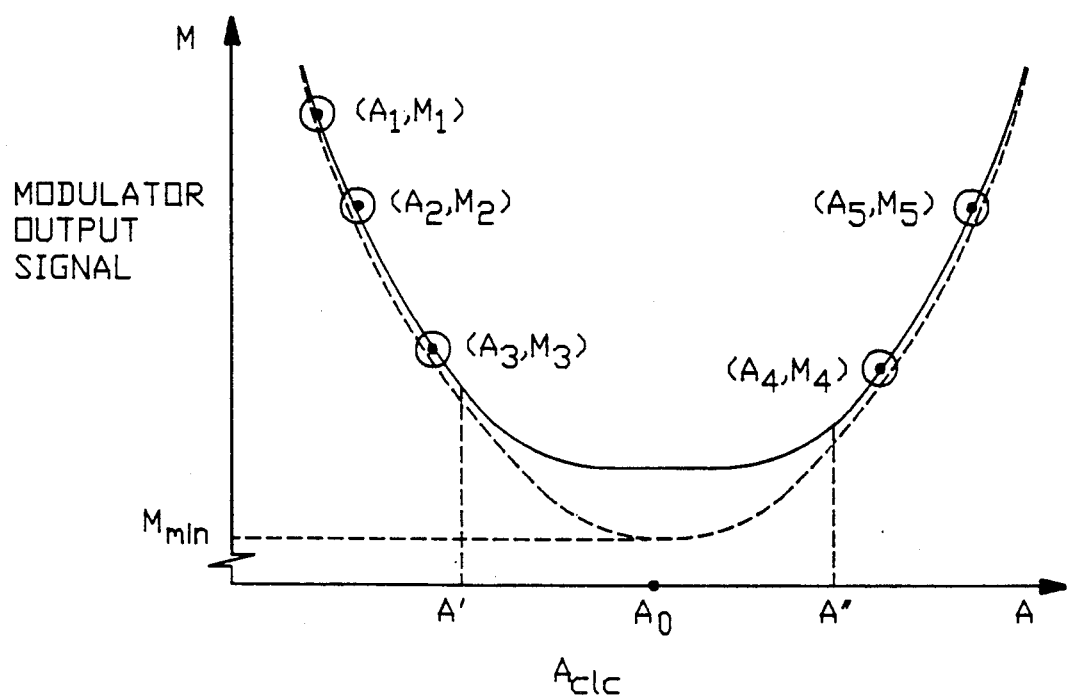
FIG. 5 is a graphical view illustrating the variation of detector output with variation of the corresponding carrier leakage compensation signal magnitude, where ancillary signals are also present.

Assume that the modulator output signal M has been measured for a sequence of K values of A so that K measured coordinate pairs (Aj, Mj) (j=1, 2,...,K) are available, with each value $A=A_j$ chosen outside the interval $A' \leq A \leq A''$ where the measured M versus A curve shown in FIG. 5 is relatively flat. The coefficients $M_{q0}$, $M_{q1}$ and $M_{q2}$ for the quadratic approximation in Eq. (23) are then found by a least squares method in which the error sum $$(M_{q0}, M_{q1}, M_{q2}) = \sum_{k=1}^{K} (M_{q0} + M_{q1}A_k + M_{q2}A_k^2 - M_k)^2 \quad (24)$$

is minimized with respect to the choices of $M_{q0}$, $M_{q1}$ and $M_{q2}$. This produces three equations in the three scalar unknowns $M_{q0}$, $M_{q1}$ and $M_{q2}$, for which the solutions may be written in matrix form as $$\begin{bmatrix} M_{q0} \\ M_{q1} \\ M_{q2} \end{bmatrix} = B^{-1} \begin{bmatrix} \sum_{k=0}^{K} M_k \\ \sum_{k=1}^{K} M_x A_k \\ \sum_{k=0}^{K} M_k(A_k)^2 \end{bmatrix} \quad (25)$$

$$B = \begin{bmatrix} a_0 & a_1 & a_2 \\ a_1 & a_2 & a_3 \\ a_2 & a_3 & a_4 \end{bmatrix} \quad (26)$$

$$a_r = \sum_{k=1}^{K} (A_k)^r \quad (r = 0, 1, 2, 3, 4). \quad (27)$$

With the numerical values $M_{q0}$, $M_{q1}$ and $M_{q2}$ in hand, the value $A=A_0$ that minimizes the approximation $M_q(A)$ to the modulator output signal is found to be $$A_0 = -M_{q1}/2M_{q2} \quad . (28)$$

This formalism need not be used if the modulator output signal curve M versus A does not have the pronounced "flat bottom" shown in FIG. 5. In order to calibrate the offset signal values, the carrier leakage compensations sources must be accurately calibrated and set to the calibrated values. Four measurements must be made when the input data signals $I_m(t)$ and $Q_m(t)$ are at values such that $A_{analog,1}$ and $A_{analog,2}$ have maximum or minimum values. These four points describe the corners of a parallelogram:

A'': $(A_{off,1} + A_{clc,1} + \text{Atten}_1 A_{analog,1 \ min}, A_{off,2} + A_{clc,2} + \text{Atten}_2 A_{analog,2 \ min})$ B'': $(A_{off,1} + A_{clc,1} + \text{Atten}_1 A_{analog,1 \ max}, A_{off,2} + A_{clc,2} + \text{Atten}_2 A_{analog,2 \ min})$ C'': $(A_{off,1} + A_{clc,1} + \text{Atten}_1 A_{analog,1 \ max}, A_{off,2} + A_{clc,2} + \text{Atten}_2 A_{analog,2 \ max})$ D'': $(A_{off,1} + A_{clc,1} + \text{Atten}_1 A_{analog,1 \ min}, A_{off,2} + A_{clc,2} + \text{Atten}_2 A_{analog,2 \ max})$ A fifth point "V" (vertex) corresponds to zero output amplitude. Compute the absolute value of the differences of the measurements of points across the parallelogram:

$$\text{Difference}_1 = |L_{A''V''} - L_{C''V''}|$$

$$\text{Difference}_2 = |L_{B''V''} - L_{D''V''}|$$

Adjust $A_{off,1}$ and $A_{off,2}$ until Difference$_1$ and Difference$_2$ are minimized.

An easier approach is to set Atten$_2$ or $Q_m(t)$ so that $A_{mod,2}$ is 0 and adjust $A_{off,1}$ until the amplitude of the signal at line 26, in FIG. 1, when $A_{analog,1}$ is maximum, is equal to the amplitude of the signal when $A_{analog,1}$ is minimum. Now set Atten$_1$ or $I_m(t)$ so that $A_{mod,1}$ is 0 and adjust $A_{off,2}$ until the amplitude of the signal at line 26, when $A_{analog,2}$ is maximum, is equal to the amplitude of the signal when $A_{analog,2}$ is minimum. In order to calibrate the offset signal sources, the carrier leakage sources and I versus Q channel gain ratio must be first calibrated and set.

In the method of calibration of vector modulators disclosed in the Edwards et al. patent,, op. cit., iteration of four different calibration steps is necessary because of the interdependence of errors. The quadrature angle cannot be calibrated correctly until carrier leakage and the I channel versus Q channel amplitude imbalance are minimized, and the I channel versus Q channel amplitude imbalance cannot be minimized until the quadrature angle is set at 90°.

The method disclosed here avoids the iterative process and performs each of the calibration steps only once, by determining first a quadrature angle error and removing it, then minimizing the I channel versus Q channel amplitude imbalance and the carrier leakage contributions.

We claim:

1. A method for quadrature calibration of a vector modulator, the method comprising the steps of:

generating a periodic first local oscillator signal $A_{in,1}$ of predetermined frequency $f_c$ and a second local oscillator signal $A_{in,2}$ that is equal to the first local oscillator signal shifted in phase by approximately 90 degrees, where these two signals are independently adjustable in phase;

providing independent, adjustable first and second carrier leakage compensation dc signals of adjustable amplitudes $A_{clc,1}$ and $A_{clc,2}$, respectively;

providing independent first and second offset dc signals of adjustable amplitudes $A_{off,1}$ and $A_{off,2}$, respectively;

providing independent first and second modulation signals of adjustable amplitudes $A_{mod,1}$ from data input signal $I_m$, and $A_{mod,2}$ from data input signal $Q_m$, respectively;

adding the first carrier leakage compensation signal $A_{clc,1}$ and the first offset signal $A_{off,1}$ to the first modulation signal $A_{mod,1}$ to produce a first compensated modulation input signal $A_{comp,1}$;

adding the second carrier leakage compensation signal $A_{clc,2}$ and the second offset signal $A_{off,2}$ to the second modulation signal $A_{mod,2}$ to produce a second compensated modulation input signal $A_{comp,2}$;

multiplying the first local oscillator signal by the first compensated modulation input signal to produce a first modulation output signal of maximum amplitude $A_{out,1} = A_{in,1} \cdot A_{comp,1}$;

multiplying the second local oscillator signal by the second compensated modulation input signal to produce a second modulation output signal of maximum amplitude $A_{out,2} = A_{in,2} \cdot A_{comp,2}$; adding the signals $A_{out1}$ and $A_{out2}$ together to form a vector sum output signal $A_{out}$;

expressing the vector sum output signal $A_{out}$ in terms of two-dimensional coordinates $(A_{out,1}, A_{out,2})$, for $A_{clc,1}$, $A_{clc,2}$, $A_{off,1}$ and $A_{off,2}$ each set equal to a respective selected signal value and for the following choices of first and second modulation input amplitudes $(A_{out,1q}, A_{out,2q})$ (q = 1, 2, 3, 4, 5, 6, 7, 8)

$q = 1 \; A_{mod,1} = r_{1,1} I \; A_{mod,2} = r_{1,2} Q$, $q = 2 \; A_{mod,1} = r_{3,1} I \; A_{mod,2} = r_{1,2} Q$, $q = 3 \; A_{mod,1} = r_{3,1} I \; A_{mod,2} = r_{3,2} Q$, $q = 4 \; A_{mod,1} = r_{1,1} I \; A_{mod,2} = r_{3,2} Q$, $q = 5 \; A_{mod,1} = r_{2,1} I \; A_{mod,2} = r_{1,2} Q$, $q = 6 \; A_{mod,1} = r_{3,1} I \; A_{mod,2} = r_{2,2} Q$, $q = 7 \; A_{mod,1} = r_{2,1} I \; A_{mod,2} = r_{3,2} Q$, $q = 8 \; A_{mod,1} = r_{1,1} I \; A_{mod,2} = r_{2,2} Q$, where I and Q are predetermined, non-zero signal values, and where $r_{1,1}$, $r_{2,1}$ and $r_{3,1}$ are predetermined values of a first attenuation parameter Atten$_1$ satisfying $0 \leq r_{1,1} < r_{2,1} < r_{3,1}$ and $r_{1,2}$, $r_{2,2}$ and $r_{3,2}$ are predetermined values of a second attenuation parameter Atten$_2$ satisfying $0 \leq r_{1,2} < r_{2,2} < r_{3,2}$, and representing these eight coordinate pairs on a two-dimensional graph to form a quadrilateral with four consecutive vertices $(A_{out,1q}, A_{out,2q})$ (q = 1, 2, 3, 4) and four intermediate boundary points for the quadrilateral $(A_{out,1q}, A_{out,2q})$ (q = 5, 6, 7, 8);

for a vertex point $(A_{v,1} A_{v,2})$ corresponding to the output signal $A_{out}$ being zero, in the plane of the quadrilateral, determining the distances $L_{qv}$ between this vertex and each of the points $(A_{out,q1}, A_{out,2q})$ (q = 1, 2, 4, 5, 8);

determining the lengths $L_{12}$ and $L_{14}$ of the sides of the quadrilateral extending from $(A_{out,1,1}, A_{out,2,1})$ to $(A_{out,1,2}, A_{out,2,2})$ and from $(A_{out,1,1}, A_{out,2,1})$ to $(A_{out,1,4}, A_{out,2,4})$, respectively, on the graph and the angle $\psi_{214}$ between the intersection of these two quadrilateral sides;

determining the value of the quadrature angular error according to the relation $\Delta\psi = \psi_{214} - \psi_0$, where $\psi_0$ is $\pm 90$ degrees;

adjusting the phase shift between the first local oscillator signal and the second local oscillator signal to reduce the magnitude of the quadrature angular error $\Delta\psi$ to a minimum;

adjusting at least one of the attenuation parameter values Atten$_1$ and Atten$_2$ so that the lengths $L_{12}$ and $L_{14}$ are of ratio R when the input signals have equivalent values, and fixing these attenuation parameter values;

with the intermediate signals $A_{mod,1}$ and $A_{mod,2}$ temporarily set equal to zero, with offset signals $A_{off,1}$ and $A_{off,2}$ temporarily set to zero, and with the quadrature angle $\psi_{214}$ set equal to $\psi_0$, adjusting the first and second carrier leakage compensation signals $A_{clc,1}$ and $A_{clc,2}$ so that the magnitude of the total output signal $A_{out,1} + A_{out,2}$ is minimized, and fixing the compensation signals $A_{clc,1}$ and $A_{clc,2}$ at these values;

adjusting the first and second offset signals $A_{off,1}$ and $A_{off,2}$ so that the amplitude of the total output signal $A_{out,1} + A_{out,2}$ is approximately the same when the data input signals cause $A_{mod,1}$ and $A_{mod,2}$ to be both at a minimum as when the data input signals cause $A_{mod,1}$ and $A_{mod,2}$ to be both at a maximum, and so that the amplitude of the total output signal $A_{out,1} + A_{out,2}$ is approximately the same when the data input causes $A_{mod,1}$ to be at a maximum and $A_{mod,2}$ to be at a minimum as when the data input signals cause $A_{mod,1}$ to be at a minimum and $A_{mod,2}$ to be at a maximum, and fixing the offset signals $A_{off,1}$ and $A_{off,2}$ at these values;

whereby the vector modulator is calibrated to approximately minimize quadrature phase angle error, to approximately minimize I to Q channel gain ratio error, and to approximately minimize carrier leakage in the output signals of the vector modulator.

2. The method of claim 1, wherein said step of determining said lengths $L_{12}$ and $L_{14}$ comprises the steps of determining said lengths $L_{12}$ and $L_{14}$ by the relations $$L_{1m} = [L_{1V}^2 - L_{mV}^2 \pm [(L_{1V}^2 - L_{mV}^2)^2 - (r_m^2 - 1)\left(\frac{1}{r_m^2}(L_{1V}^2 - L_{ImV}^2)^2 - (L_{mV}^2 - L_{ImV}^2)^2\right)]^{\frac{1}{2}} (r_m + 1)/(r_m - 1)]^{\frac{1}{2}} \; (m = 2, 4)$$

$(r_m \neq 1)$ $$L_{1m} = 2^{(\frac{1}{2})}[L_{1V}^2 + L_{mV}^2 - 2L_{ImV}^2]^{\frac{1}{2}} (r_m = 1)$$

$r_2 = (r_{2,1} - 4_{1,1})/(r_{3,1} - r_{2,1})$, $r_4 = (r_{2,2} - r_{1,2})/(r_{3,2} - r_{2,2})$, $L_{12V} = L_{5V}$, $L_{14V} = L_{8V}$.

3. The method of claim 2, further comprising the step of setting each of said attenuation parameters $r_2$ and $r_4$ approximately equal to 1.

4. The method of claim 1, further comprising the step of choosing said predetermined angle $\psi_0 = 90°$.

5. The method of claim 1, further comprising the step of choosing said predetermined angle $\psi_0 = -90°$.

6. Apparatus for quadrature calibration of a vector modulator that receives a first carrier signal, a second carrier signal that is the first carrier signal shifted in phase by approximately 90°, a first modulation signal and a second modulation signal, that forms the product of the first carrier and modulation signals as a first composite signal, that forms the product of the second carrier and modulation signals as a second composite signal, and that forms and issues the sum of the first and second composite signals as a vector sum output signal, the apparatus comprising:

signal attenuation means for receiving first and second modulation signals, $L_{1m}(t)$ and $I_{2m}(t)$, respectively, and for issuing as output signals the signals $r_1 I_{1m}(t)$ and $r_2 I_{2m}(t)$, respectively, as first and second attenuated modulation signals, where $R_1$ and $r_2$ are two independently adjustable, non-negative real numbers;

an offset voltage source that produces and issues adjustable dc output signals $I_{1,off}$ and $I_{2,off}$;

first and second carrier leakage compensation sources that produce and issue independently adjustable dc voltage output signals $I_{1,CLC}$ and $I_{2,CLC}$;

first signal sum means for receiving the signals $r_1 I_{1m}(t)$, $I_{1,off}$ and $I_{1,CLC}$ as input signals and for forming and issuing an intermediate output signal $I_{1m}'(t) = r_1 I_{1m}(t) + I_{1,off} + I_{1,CLC}$;

second signal sum means for receiving the signals $r_2 I_{2m}(t)$, $I_{2,off}$ and $I_{2,clc}$ as input signals and for forming and issuing an intermediate output signal $I_{2m}'(t) = r_2 I_2(t) + I_{2,off} + I_{2,CLC}$;

first and second phase shift means for receiving the first carrier signal $I_{1c}(t)$ and the second carrier signal $I_{2c}(t)$, respectively, for introducing independent phase shifts $\phi_1$ and $\phi_2$, respectively, in these two carrier signals, and for issuing the phase shifted signals as output signals $I_{1c}(t,\phi_1)$ and $I_{2c}(t,\phi_2)$, respectively;

first mixer means for receiving the signals $I_{1m}'(t)$ and $I_{1c}(t,\phi_1)$ as input signals and for forming and issuing the product signal $I_{1m}'(t) \cdot I_{1c}(t,\phi_1)$ as an output signal;

second mixer means for receiving the signals $I_{2m}'(t)$ and $I_{2c}(t,\phi_2)$ as input signals and for forming and issuing the product signal $I_{2m}'(t) \cdot I_{2c}(t,\phi_2)$ as an output signal;

third signal sum means for receiving the signals $I_{1m}'(t) \cdot I_{1c}(t,\phi_1)$ and $I_{2m}'(t) \cdot I_{2c}(t,\phi_2)$ as input signals and for forming and issuing the vector sum $I_{out}(t) = I_{1m}'(t) \cdot I_{1c}(t,\phi_1) + I_{2m}'(t) \cdot I_{2c}(t,\phi_2)$ as an output signal;

a calibrated signal detector for receiving the signal $I_{out}(t)$ and for determining and issuing the maximum amplitude of this signal as an output signal;

output signal processing means for receiving and determining the signal detector output signal amplitudes for each of at least five combinations of the selected attenuation numbers $(r_1, r_2) = (R_{i,j}, r_{j,2})$ ($i = 1, 2, 3; j = 1, 2, 3$), and for determining the phase angle between the two signals $I_{1m}'(t) \cdot I_{1c}(t,\phi_1)$ and $I_{2m}'(t) \cdot I_{2c}(t,\phi_2)$;

phase shift adjustment means, connected to the first and second phase shift means, for adjusting the first and second phase shifts $\phi_1$ and $\phi_2$ so that the phase difference angle $\psi$ of the signals $I_{1m}' \cdot I_{1c}(t,\phi_1)$ and $I_{2m}'(t) \cdot I_{2c}(t,\phi_2)$ satisfies $\psi = \psi_0$, where $\psi_0$ is a predetermined angle, and for fixing the phase shifts $\phi_1$ and $\phi_2$ at these values;

gain adjustment means, connected to the signal processing means, for adjusting and fixing the parameters $r_1$ and $r_2$, employing measurements made when calibrating the phase offset, so that, when $I_{off,1}$ and $I_{off,2}$ is set to zero, and when $I_{CLC,1}$ and $I_{CLC,2}$ is set such that the magnitude of $I_{out}(t)$ is minimized with $I_{1m}(t) = I_{2m}(t) = I_{off,1} = I_{off,2} = 0$, the ratio of $I_{out}(t)$, when $I_{1m}(t)$ is a non-zero constant value K and $I_{2m}(t) = 0$, divided by the magnitude of $I_{out}(t)$, when $I_{1m}(t) = 0$ and $I_{2m}(t) = K$, is equal to R;

carrier leakage compensation means, connected to the first and second carrier leakage compensation sources, to the signal processing means, for temporarily setting $I_{1m}(t) = 0$, $I_{2m}(t) = 0$, $I_{1,off} = 0$ and $I_{2,off} = 0$, for adjusting the signals $I_{1,CLC}$ and $I_{2,CLC}$ to values for which the maximum magnitude of the vector sum of the output signals $I_{1m}'(t) I_{1c}(t,\phi_1) + I_{2m}'(t) I_{2c}(t,\phi_2)$ is minimized, and for fixing the values of $I_{1,CLC}$ and $I_{2,CLC}$ at these values; and offset source adjustment means, connected to the offset voltage source and to the signal processing means, for adjusting the signals $I_{1,off}$ and $I_{2,off}$ so that the amplitude of the output signal $I_{out}(t)$, when the first modulation signal $I_{1m}(t)$ and the second modulation signal $I_{2m}(t)$ are both at a minimum, is approximately equal to the amplitude of $I_{out}(t)$, when the two modulation signals $I_{1m}(t)$ and $I_{2m}(t)$ are both at a maximum, and so that the amplitude of $I_{out}(t)$, when $I_{1m}(t)$ is at a maximum and $I_{2m}(t)$ is at a minimum, is approximately equal to the amplitude of $I_{out}(t)$, when $I_{1m}(t)$ is at a minimum and $I_{2m}(t)$ is at a maximum.

7. The apparatus of claim 6, wherein said predetermined angle $\psi_0 = 90°$.

8. The apparatus of claim 6, wherein said predetermined angle $\psi_0 = -90°$.

9. The apparatus of claim 6, wherein said ratio R is approximately 1.

10. A method of calibrating a vector modulator having a signal approximately in phase to an input uncalibrated RF source (13) and a signal approximately 9020 out-of-phase, or in quadrature, to the input RF source (13), the in-phase signal is modified by a first modulation signal $I_m$ and a first offset signal (37) and a first leakage signal (39) through a first mixer (19), the quadrature-phase signal is modified by a second modulation signal $Q_m$ and a second offset signal (47) and a second leakage signal (49) through a second mixer (23), the modified in-phase signal is combined with the modified quadrature-phase signal as the output signal, the output signal is measured by a calibrated scaler detector (27), comprising the following steps:

(a) measuring the phase between the in-phase signal and the quadrature-phase signal of the uncalibrated RF source (13) using a calibrated scaler detector (27);

(b) measuring and adjusting the phase between the in-phase signal and the quadrature-phase signal till the phase is as close to 90° as possible;

(c) selectively introducing attenuation into the two paths from the inputs of the modulation signals $I_m$ and $Q_m$ to the calibrated scaler detector (27) to equalize the attenuation of each path;

(d) selectively introducing leakage signal (39, 49) to the IF ports of the first and second mixers (19, 23) to minimize the output signal when the first and second offset signals (37, 47) and the first and second modulation signals are nulled;

(e) selectively introducing offset signal (37, 47) to equalize the output signal (i) when the second modulation signal ia maximally positive and maximally negative with the first modulation signal nulled and (ii) when the first modulation signal is maximally positive and maximally negative with the second modulation signal nulled; and (f) setting the phase between the in-phase signal and the quadrature-phase signal to any predetermined value.

* * * * *